United States Patent
Ueda et al.

(10) Patent No.: US 9,599,746 B2
(45) Date of Patent: Mar. 21, 2017

(54) METHODS FOR WORKING AND SENSING SYNTHETIC QUARTZ GLASS SUBSTRATE

(71) Applicant: SHIN-ETSU CHEMICAL CO., LTD., Tokyo (JP)

(72) Inventors: Shuhei Ueda, Joetsu (JP); Masaki Takeuchi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/645,908

(22) Filed: Mar. 12, 2015

(65) Prior Publication Data
US 2015/0260877 A1 Sep. 17, 2015

(30) Foreign Application Priority Data
Mar. 17, 2014 (JP) .................................. 2014-053468

(51) Int. Cl.
| | | |
|---|---|---|
| *C03C 15/00* | (2006.01) | |
| *G01V 8/12* | (2006.01) | |
| *C23C 16/02* | (2006.01) | |
| *C03C 17/09* | (2006.01) | |
| *C03C 23/00* | (2006.01) | |
| *B24B 37/04* | (2012.01) | |
| *B24B 49/12* | (2006.01) | |

(52) U.S. Cl.
CPC .............. *G01V 8/12* (2013.01); *B24B 37/042* (2013.01); *B24B 49/12* (2013.01); *C03C 15/00* (2013.01); *C03C 17/09* (2013.01); *C03C 23/007* (2013.01); *C03C 23/0075* (2013.01); *C23C 16/0227* (2013.01); *C03C 2204/08* (2013.01); *C03C 2217/252* (2013.01); *C03C 2217/258* (2013.01); *C03C 2217/28* (2013.01)

(58) Field of Classification Search
None
See application file for complete search history.

(56) References Cited

U.S. PATENT DOCUMENTS

| | | | | |
|---|---|---|---|---|
| 6,413,682 B1* | 7/2002 | Shibano | .................. | C03B 19/12 430/5 |
| 6,611,317 B1* | 8/2003 | Ogawa | ................ | G03F 7/70058 355/30 |
| 2002/0046580 A1* | 4/2002 | Matsuo | ............... | C03B 19/1453 65/397 |
| 2003/0102229 A1* | 6/2003 | Inuzuka | ............. | B65D 75/5855 206/219 |
| 2003/0186624 A1 | 10/2003 | Koike et al. | | |
| 2004/0238487 A1* | 12/2004 | Kiehlbauch | ............. | C03C 15/00 216/52 |
| 2007/0145014 A1* | 6/2007 | Nishimoto | .............. | C03C 19/00 216/97 |
| 2010/0243950 A1* | 9/2010 | Harada | ................... | B24B 37/00 252/79.5 |
| 2010/0266874 A1 | 10/2010 | Uchiyama et al. | | |
| 2013/0306995 A1 | 11/2013 | Park | | |

FOREIGN PATENT DOCUMENTS

| | | | |
|---|---|---|---|
| JP | 9-199465 A | | 7/1997 |
| JP | 11335140 A | * | 12/1999 |
| JP | 3473654 B2 | | 12/2003 |

OTHER PUBLICATIONS

Extended European Search Report dated Oct. 8, 2015, issued in counterpart European Patent Application No. 15158485.1 (6 pages).

* cited by examiner

*Primary Examiner* — Shamim Ahmed
(74) *Attorney, Agent, or Firm* — Westerman, Hattori, Daniels & Adrian, LLP

(57) ABSTRACT

A synthetic quartz glass substrate having front and back surfaces is worked by lapping, etching, mirror polishing, and cleaning steps for thereby polishing the front surface of the substrate to a mirror-like surface. The etching step is carried out using a hydrofluoric acid solution at pH 4-7.

8 Claims, No Drawings

METHODS FOR WORKING AND SENSING SYNTHETIC QUARTZ GLASS SUBSTRATE

CROSS-REFERENCE TO RELATED APPLICATION

This non-provisional application claims priority under 35 U.S.C. §119(a) on Patent Application No. 2014-053468 filed in Japan on Mar. 17, 2014, the entire contents of which are hereby incorporated by reference.

TECHNICAL FIELD

This invention relates to a method for working a front surface of a synthetic quartz glass substrate to a mirror-like surface, and a method for sensing the substrate.

BACKGROUND ART

Since the semiconductor fabrication apparatus includes a series of stages for introducing, processing and carrying semiconductor substrates, a number of sensors are built in the apparatus. Exemplary sensors include a sensor for detecting the presence or absence of a substrate, a sensor for confirming the position or attitude of the substrate, and sensors for detecting edge, notch, orientation flat, thickness, shift, tilt and other parameters. In this application, photoelectric sensors capable of detecting the presence or absence of an object or any change of surface state by utilizing light are mostly used.

The photoelectric sensor is composed of an emitter section for emitting input light and a receiver section for receiving output light. If emitted light is blocked or reflected by an object to be detected, the quantity of light reaching the receiver section changes. The receiver section detects this change, converts it into an electric signal, and delivers the output. The light sources used in the sensors are mainly those of visible light, typically red, or green and blue for color discrimination, and infrared light.

Many semiconductor devices use single crystal silicon substrates while germanium, gallium arsenide (GaAs), gallium arsenide phosphide (GaAsP), gallium nitride (GaN), silicon carbide (SiC), and the like are also used. Since all these substrates are opaque, the sensors in the semiconductor apparatus are designed for opaque substrates.

For the detection of substrates in the semiconductor apparatus, front and back surfaces of substrates are given suitable means for enhancing the certainty of detection. For example, in the preparation of silicon substrates, if both surfaces of wafers are mirror-like surfaces, the front and back surfaces are not discriminatable. Then, the sensors in the processing apparatus do not perform well, or mirror-surface wafers slip away as they are carried forward. If the front and back surfaces of a substrate are separately processed, then the sensors in the semiconductor apparatus perform well because of a quality difference between the front and back surfaces. See Patent Document 1.

Recently, there arises a need to fabricate devices on transparent substrates rather than opaque substrates. Inter alia, synthetic quartz glass is substantially free of impurities and has excellent properties including light transmittance, heat resistance, coefficient of thermal expansion, and insulation. The glass is expected to find use in many fields, for example, as semiconductor devices, typically high temperature polysilicon thin film transistors (TFT), and microelectro-mechanical systems (MEMS).

CITATION LIST

Patent Document 1: JP-A H09-199465

DISCLOSURE OF INVENTION

However, if transparent substrates are introduced into a general semiconductor fabrication line or apparatus originally designed to process opaque substrates, the photoelectric sensors in the apparatus fail to detect the substrates. New detectors must be added to the apparatus. Also, when synthetic quartz glass substrates are introduced into the semiconductor line or apparatus, it is necessary to minimize the generation of dust or particles in the line or apparatus.

An object of the invention is to provide a method for working a synthetic quartz glass substrate for finishing the front surface to a mirror-like surface such that when the transparent synthetic quartz glass substrate is introduced into a semiconductor apparatus, the substrate may have a light blocking ability, be sensed like opaque substrates, and minimize dust (or particle) generation from the back surface. Another object is to provide a method for sensing such a synthetic quartz glass substrate.

In one aspect, the invention provides a method for working a synthetic quartz glass substrate, comprising at least the steps of lapping, etching, mirror polishing, and cleaning a synthetic quartz glass substrate having front and back surfaces for thereby polishing the front surface to a mirror-like surface, characterized in that the etching step uses hydrofluoric acid or buffered hydrofluoric acid at pH 4 to 7.

In a preferred embodiment, the method may further comprise a heat treatment step between the etching step and the mirror polishing step.

In a preferred embodiment, the back or non-mirror-like surface of the substrate at the end of lapping step has a surface roughness (Ra) of 0.1 to 0.2 µm.

In a preferred embodiment, the back or non-mirror-like surface of the substrate at the end of etching step has a surface roughness (Ra) of 0.15 to 0.25 µm.

In a preferred embodiment, the back or non-mirror-like surface of the substrate at the end of mirror polishing step has a surface roughness (Ra) of 0.15 to 0.25 µm.

In a preferred embodiment, the front surface of the synthetic quartz glass substrate at the end of mirror polishing step has a surface roughness (Ra) of 0.1 to 0.8 nm, which is less than the surface roughness (Ra) of the back surface.

In a preferred embodiment, the cleaning step includes cleaning with 0.1 to 2% by weight hydrofluoric acid and/or pure water while applying ultrasonic wave in an intermediate or high frequency band to the front and back surfaces of the substrate.

In a preferred embodiment, after the cleaning step, a thin film is formed on the back surface of the substrate by vapor deposition.

In another aspect, the invention provides a method for sensing a synthetic quartz glass substrate in a semiconductor apparatus, the semiconductor apparatus being equipped with a photoelectric sensor having emitter and receiver sections, the method comprising the steps of introducing into the semiconductor apparatus a synthetic quartz glass substrate having one mirror-like surface, which has been worked by the method defined above, and operating the sensor such that the emitter section may emit input light to one surface of the substrate and the receiver section may receive output light from the other surface, for thereby sensing the substrate.

Advantageous Effects of Invention

By the method of the invention, a synthetic quartz glass substrate is worked into a substrate having a front surface which is mirror-like and a back surface which is non-mirror-like or rough. Even when a photoelectric sensor designed for opaque substrates is used, the substrate has a light blocking ability and can be sensed like opaque substrates. The dust generation from the back surface is suppressed.

DESCRIPTION OF PREFERRED EMBODIMENTS

The method for working or processing a synthetic quartz glass substrate having front and back surfaces according to the invention involves at least lapping, etching, mirror polishing, and cleaning steps for thereby polishing the front surface of the substrate to a mirror-like surface. The invention is characterized in that hydrofluoric acid or buffered hydrofluoric acid at pH 4 to 7 is used in the etching step.

The starting substrate is a synthetic quartz glass substrate. From the aspect of inhibiting the substrate from chipping and cracking, it is preferred that a synthetic quartz glass substrate has been chamfered and mirror finished at the edge.

In the lapping step, the front and back surfaces of the substrate are preferably lapped on a double-side lapping machine using a lapping slurry based on alumina grains, specifically with a grit size of #800 to #1500, more specifically #1000 to #1200, until a surface roughness necessary for etching is reached. From the aspects of enabling substrate detection like silicon wafers and inhibiting particle generation, the back surface of the substrate at the end of lapping step should preferably have a surface roughness (Ra) of 0.1 to 0.2 µm, more preferably 0.13 to 0.16 µm, as measured according to JIS D-1601.

The subsequent etching step is carried out on the front and back surfaces of the substrate in order to facilitate sensing and particle removal. The etchant used in the etching step is hydrofluoric acid or buffered hydrofluoric acid at pH 4 to 7, preferably pH 4.5 to 7.0. Below pH 4, the zeta potentials on particles and synthetic quartz glass substrate surface are of opposite signs, indicating difficult removal of particles. Above pH 7, the etching rate is extremely retarded. Specifically, 5 to 25 wt % hydrofluoric acid aqueous solution or buffered hydrofluoric acid containing 5 to 40 wt % ammonium fluoride and 5 to 25 wt % hydrogen fluoride may be used at a pH level in the above range. From the aspects of sensor light blocking and definite sensing, the back (or rough) surface of the substrate at the end of etching step should preferably have a surface roughness (Ra) of 0.15 to 0.25 µm, more preferably 0.19 to 0.24 µm, as measured according to JIS D-1601.

If desired, heat treatment is carried out between the etching step and the mirror polishing step. Since later deposition and annealing steps generally involve elevated temperature, this heat may cause to develop glass debris which will shed from the rough surface side. Previous heat treatment is effective for minimizing the development of glass debris during the later deposition and annealing steps and therefore, reducing the number of dust particles generated on the final product. From the aspect of development of sufficient glass debris by heat treatment, the ultimate temperature of heat treatment is preferably in a range of 600 to 1,200° C., more preferably 900 to 1,200° C. The heating rate is not particularly limited. From the aspect of development of sufficient glass debris, the heating rate is preferably 100 to 300° C./hr, more preferably 200 to 300° C./hr. The holding time at the ultimate temperature is not particularly limited. From the aspect of development of sufficient glass debris, the holding time is preferably 5 to 30 minutes, more preferably 10 to 30 minutes.

Next, with the back surface of the synthetic quartz glass substrate kept intact, the front surface is mirror polished on a single-side polishing machine. If abrasive grains are moved around and anchored to the rough surface side, the anchored grains are removed with difficulty during the subsequent cleaning step and can be a dust source. For this reason, colloidal silica is used as the abrasive.

From the aspects of sensor light blocking and definite sensing, the back (or rough) surface of the substrate at the end of single-side polishing step should preferably have a surface roughness (Ra) of 0.15 to 0.25 µm, more preferably 0.19 to 0.24 µm, as measured according to JIS D-1601. The front surface of the substrate at the end of single-side polishing step should preferably have a surface roughness (Ra) of 0.1 to 0.8 nm, more preferably 0.1 to 0.4 nm, which is less than the surface roughness (Ra) of the back surface.

The final cleaning step is carried out on the front and back surfaces of the substrate and may be either dip type cleaning or single-wafer spin cleaning. The single-wafer spin cleaning is preferred from the aspect of preventing particles (removed from the rough surface side) from moving around to the mirror-like surface side. Specifically, the synthetic quartz glass substrate is cleaned, especially spin cleaned with 0.1 to 2% by weight hydrofluoric acid and/or pure water while ultrasonic wave in an intermediate frequency band (78 to 430 kHz) or a high frequency band, i.e., megasonic band (500 kHz to 5 MHz) is applied to the front and back surfaces of the substrate. This is followed by spin drying.

A thin film may be deposited on the back (or rough) surface of the substrate by a vapor deposition technique, e.g., evaporation or CVD, if desired for increasing the percent light blockage and achieving definite sensing. Typical of the thin film are a Si film, Al film and Ti film having a thickness of 0.2 to 1.0 µm.

The planar shape of the synthetic quartz glass substrate thus worked is not particularly limited and may be either rectangular or circular. Also the substrate is not particularly limited in size although it preferably has a diagonal length or diameter of 50 to 300 mm. The synthetic quartz glass substrate having one mirror-like surface may have any appropriate thickness, preferably 0.1 to 30 mm, more preferably 0.15 to 10 mm, and even more preferably 0.3 to 1.2 mm.

Another embodiment of the invention is a method for sensing a synthetic quartz glass substrate in a semiconductor apparatus, the semiconductor apparatus being equipped with a photoelectric sensor having emitter and receiver sections. The synthetic quartz glass substrate having one mirror-like surface, obtained as above, is introduced into the semiconductor apparatus. Then the sensor is operated such that the emitter section may emit input light to one surface of the substrate and the receiver section may receive output light from the other surface, for thereby sensing the substrate.

EXAMPLE

Examples of the invention are given below by way of illustration and not by way of limitation.

Example 1

A synthetic quartz glass substrate having an outer diameter of 200 mm and a thickness of 1 mm was furnished as the starting substrate having rough surfaces and chamfered/mirror-finished edges. The substrate was lapped on a double-side lapping machine using a lapping slurry based on alumina grains of #1200, to roughen its front and back surfaces. The front and back surfaces of the synthetic quartz glass substrate at the end of lapping had a surface roughness (Ra) of 0.10 µm, as measured according to JIS D-1601.

Subsequent to the lapping step, the substrate on its front and back surfaces was etched with hydrofluoric acid (HF) aqueous solution at pH 4.0 for 5 minutes. The front and back surfaces of the substrate at the end of etching had a surface roughness (Ra) of 0.15 µm, as measured according to JIS D-1601.

Next, the front surface of the substrate was polished on a single-side polishing machine using 40 wt % colloidal silica as polishing slurry. The front surface of the substrate at the end of polishing had a surface roughness (Ra) of 0.15 nm, as measured according to JIS D-1601. On measurement, the back surface of the substrate had a surface roughness (Ra) of 0.15 µm.

Thereafter, while megasonic wave at 1.5 MHz was applied to the front and back surfaces of the substrate, the substrate was spin cleaned with 0.5 wt % hydrofluoric acid, cleaned with pure water, and spin dried. Finally, a silicon film of 1 µm thick was deposited on the rough surface of the substrate by CVD.

The synthetic quartz glass substrate having one mirror-like surface, thus obtained, was examined by the following tests, with the results shown in Table 1.

[Dust Evaluation]

In a clean plastic case for silicon wafers, synthetic quartz glass substrates having one mirror-like surface, which had been worked as above, and synthetic quartz glass substrates having both mirror-like surfaces, which had been confirmed for cleanliness, were alternately and horizontally inserted (the latter substrate being disposed adjacent to the rough surface of the former substrate). The case was packed with total 20 substrates, with each set of two substrates, and tightly closed with a lid.

The case was subjected to vibration at an acceleration of 0.75 G and a frequency of 20 Hz for 30 minutes according to JIS Z-0232: method of vibration test on packaged freights. Dust particles dropped from the back (or rough) surface of the upper glass substrate having one mirror-like surface onto the opposed surface of the lower glass substrate having both mirror-like surfaces. The number of dust particles dropped was visually counted by projecting light under 200,000 lux in a darkroom. An average count was 8.9 particles.

For comparison sake, the plastic case was packed with glass substrates by the same procedure as above except that synthetic quartz glass substrates having both mirror-like surfaces, which had been confirmed for cleanliness, were inserted instead of the synthetic quartz glass substrates having one mirror-like surface. After the same vibration test, the count of dust particles dropping from the back surface of the upper glass substrate having both mirror-like surfaces onto the opposed surface of the lower glass substrate having both mirror-like surfaces was 8.5 particles on average. With respect to dust transfer count, the glass substrates having one mirror-like surface and the glass substrates having both mirror-like surfaces as reference showed a difference of no significance.

[Sensing Test]

Using a combination of emitter FS-V21X (950 nm) and receiver FS-V22X from Keyence Corp., it was examined whether or not a synthetic quartz glass substrate was detectable with light of wavelength 950 nm.

The term "detectable" means that the glass substrate is recognized because light is fully blocked by the glass substrate without being transmitted to the receiver side. The term "undetectable" means that the glass substrate is not recognized because light is transmitted to the receiver side and not fully blocked by the glass substrate.

With the relevant wavelength, the presence or absence of a synthetic quartz glass substrate in this Example was detectable at an acceptable sensitivity.

Example 2

A synthetic quartz glass substrate having one mirror-like surface was obtained as in Example 1 except that the starting substrate was lapped on a double-side lapping machine using a lapping slurry based on alumina grains of #1000, to roughen its front and back surfaces. The glass substrate was evaluated by the same tests, with the results shown in Table 1. The average dust count was 8.9 particles.

Example 3

A synthetic quartz glass substrate having one mirror-like surface was obtained as in Example 1 except that the etching step used buffered hydrofluoric acid aqueous solution (BHF; aqueous solution containing 30 wt % ammonium fluoride and 10 wt % hydrogen fluoride) at pH 7.0 instead of hydrofluoric acid solution at pH 4.0. The glass substrate was evaluated by the same tests, with the results shown in Table 1.

Example 4

A synthetic quartz glass substrate having one mirror-like surface was obtained as in Example 1 except that a heat treatment step was interposed between the etching step and the mirror polishing step. The heat treatment was in a heating furnace KBF663N1 (Koyo Thermo Systems Co., Ltd.) where the substrate was heated from room temperature to an ultimate temperature of 700° C. at a heating rate of 150° C./hr and held at the ultimate temperature for 10 minutes. The glass substrate was evaluated by the same tests, with the results shown in Table 1.

Example 5

A synthetic quartz glass substrate having one mirror-like surface was obtained as in Example 1 except that a heat treatment step was interposed between the etching step and the mirror polishing step. Like Example 4, the heat treatment was in the furnace where the substrate was heated from room temperature to an ultimate temperature of 1,100° C. at a heating rate of 250° C./hr and held at the ultimate temperature for 30 minutes. The glass substrate was evaluated by the same tests, with the results shown in Table 1.

Comparative Example 1

A synthetic quartz glass substrate having one mirror-like surface was obtained as in Example 1 except that the etching step used a nitric acid/hydrogen fluoride mixed aqueous solution (aqueous solution containing 10 wt % nitric acid and 10 wt % hydrogen fluoride) at pH 1.0 instead of hydrofluoric acid solution at pH 4.0. The glass substrate was evaluated by the same tests, with the results shown in Table 1.

Comparative Example 2

A synthetic quartz glass substrate having one mirror-like surface was obtained as in Example 1 except that the etching step used a sodium hydroxide aqueous solution at pH 7.5 instead of hydrofluoric acid solution at pH 4.0. The glass substrate was evaluated by the same tests, with the results shown in Table 1.

TABLE 1

| | Etchant | | Surface roughness Ra (μm) | | | Average dust count (particles) | | |
|---|---|---|---|---|---|---|---|---|
| | Type | pH | Front/back surfaces | Rough surface after | Rough surface after | One-side mirror surface | Double-side mirror | Sensing |
| Example 1 | HF | 4.0 | 0.10 | 0.15 | 0.15 | 8.9 | 6.8 | detectable |
| Example 2 | HF | 4.0 | 0.20 | 0.25 | 0.25 | 8.6 | 6.8 | detectable |
| Example 3 | BHF | 7.0 | 0.20 | 0.25 | 0.25 | 8.5 | 6.8 | detectable |
| Example 4 | HF | 4.0 | 0.10 | 0.15 | 0.15 | 7.0 | 6.8 | detectable |
| Example 5 | HF | 4.0 | 0.10 | 0.15 | 0.15 | 6.8 | 6.8 | detectable |
| Comparative Example 1 | $HNO_3$ + HF | 1.0 | 0.10 | 0.13 | 0.13 | 2,800 | 6.8 | detectable |
| Comparative Example 2 | NaOH | 7.5 | 0.10 | 0.11 | 0.11 | 800 | 6.8 | undetectable |

Japanese Patent Application No. 2014-053468 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for working a synthetic quartz glass substrate, comprising the steps, in the recited order, of lapping, etching, mirror polishing, and cleaning the synthetic quartz glass substrate having front and back surfaces for thereby polishing the front surface to a mirror-like surface,
    wherein, in the etching step, etching of the front and back surfaces of the synthetic quartz glass substrate is performed with hydrofluoric acid or buffered hydrofluoric acid at pH 4 to 7, and
    wherein a heat treatment in a heating furnace is carried out between the etching step and the mirror polishing step.

2. The method of claim 1 wherein the back surface of the synthetic quartz glass substrate at the end of lapping step has a surface roughness (Ra) of 0.1 to 0.2 μm.

3. The method of claim 1 wherein the back surface of the synthetic quartz glass substrate at the end of etching step has a surface roughness (Ra) of 0.15 to 0.25 μm.

4. The method of claim 1 wherein the back surface of the synthetic quartz glass substrate at the end of mirror polishing step has a surface roughness (Ra) of 0.15 to 0.25 μm.

5. The method of claim 1 wherein the front surface of the synthetic quartz glass substrate at the end of mirror polishing step has a surface roughness (Ra) of 0.1 to 0.8 nm, which is less than the surface roughness (Ra) of the back surface.

6. The method of claim 1 wherein the cleaning step includes cleaning with 0.1 to 2% by weight hydrofluoric acid and/or pure water while applying ultrasonic wave in an intermediate or high frequency band to the front and back surfaces of the substrate.

7. The method of claim 1, further comprising, after the cleaning step, the step of forming a thin film on the back surface of the synthetic quartz glass substrate by vapor deposition.

8. The method of claim 1, wherein a temperature of the heat treatment is in a range of 600 to 1,200° C. and a heating rate is in a range of 100 to 300° C./hr.

* * * * *